(12) United States Patent
Sirkis et al.

(10) Patent No.: US 6,713,969 B2
(45) Date of Patent: Mar. 30, 2004

(54) METHOD AND APPARATUS FOR DETERMINATION AND CONTROL OF PLASMA STATE

(75) Inventors: Murray Sirkis, Tempe, AZ (US); Wayne L. Johnson, Phoenix, AZ (US); Andrej Mitrovic, Phoenix, AZ (US); Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/355,173

(22) Filed: Jan. 31, 2003

(65) Prior Publication Data

US 2003/0141822 A1 Jul. 31, 2003

Related U.S. Application Data

(60) Provisional application No. 60/352,546, filed on Jan. 31, 2002.

(51) Int. Cl.[7] .................................................. H01J 7/24
(52) U.S. Cl. .............................. 315/111.21; 315/111.81; 438/726; 438/728; 118/723 MW; 118/723 R; 356/482
(58) Field of Search ..................... 315/111.21, 111.81, 315/39.61, 39.65, 501, 502; 118/723 R, 723 MW, 723 ER, 723 IR; 204/157.15, 555, 556; 313/231.31; 438/9, 16, 726, 728, 730; 356/482, 513

(56) References Cited

U.S. PATENT DOCUMENTS

| | | | | |
|---|---|---|---|---|
| 4,891,095 A | * | 1/1990 | Ishida et al. | 438/726 |
| 4,970,435 A | * | 11/1990 | Tanaka et al. | 315/111.21 |
| 5,227,797 A | | 7/1993 | Murphy | 342/22 |
| 5,463,698 A | | 10/1995 | Meyer | 382/276 |
| 5,907,594 A | | 5/1999 | Lai | 378/4 |
| 5,960,056 A | | 9/1999 | Lai | 378/4 |
| 6,025,916 A | * | 2/2000 | Quick et al. | 356/503 |
| 6,139,697 A | * | 10/2000 | Chen et al. | 204/192.15 |
| 6,174,450 B1 | * | 4/2001 | Patrick et al. | 216/61 |
| 6,390,019 B1 | * | 5/2002 | Grimbergen et al. | 118/723 R |
| 6,545,420 B1 | * | 4/2003 | Collins et al. | 315/111.51 |

\* cited by examiner

*Primary Examiner*—Haissa Philogene
(74) *Attorney, Agent, or Firm*—Oblon, Spivak, McClelland, Maier & Neustadt, P.C.

(57) ABSTRACT

A plasma processing system that includes a plasma chamber, an open resonator movably mounted within the plasma chamber, and a detector. The open resonator produces a microwave signal, and the detector detects the microwave signal and measures a mean electron plasma density along a path of the signal within a plasma field. Alternatively, the plasma processing system includes a plasma chamber, a plurality of open resonators provided within the plasma chamber, a plurality of detectors, and a processor. The processor is configured to receive a plurality of mean electron plasma density measurements from the detectors that correspond to locations of the plurality of open resonators.

45 Claims, 5 Drawing Sheets

METHOD AND APPARATUS FOR DETERMINATION AND CONTROL OF PLASMA STATE

CROSS-REFERENCE TO RELATED APPLICATIONS

This application is related to and claims priority to U.S. provisional serial No. 60/352,546, filed on Jan. 31, 2002, the entire contents of which are herein incorporated by reference. This application is related to co-pending International Application No. PCT/US00/19539, Publication No. WO 01/06402, published on Jan. 25, 2001; International Application No. PCT/US00/19536, Publication No. WO 01/06544, published on Jan. 25, 2001; International Application No. PCT/US00/19535, Publication No. WO 01/06268, published on Jan. 25, 2001; International Application No. PCT/US00/19540, Publication No. WO 01/37306, published on May 25, 2001; U.S. Application Serial No. 60/330,518, entitled "Method and apparatus for wall film monitoring", filed on Oct. 24, 2001; U.S. Application Serial No. 60/330,555, entitled "Method and apparatus for electron density measurement", filed on Oct. 24, 2001; co-pending U.S. Application Serial No. 60/352,502, entitled "Method and apparatus for electron density measurement and verifying process status," filed on Jan. 31, 2002; co-pending U.S. Application Serial No. 60/352,503, entitled "Apparatus and method for improving microwave coupling to a resonant cavity," filed on Jan. 31, 2002; and co-pending U.S. Application Serial No. 60/352,504, entitled "Method and apparatus for monitoring and verifying equipment status," filed on Jan. 31, 2002. The contents of those applications are incorporated herein by reference.

BACKGROUND OF THE INVENTION

1. Field of the Invention

The present invention generally relates to fabrication of integrated circuits in the semiconductor industry.

2. Discussion of the Background

The fabrication of integrated circuits (IC) in the semiconductor industry typically employs plasma to create and assist surface chemistry within a plasma processing chamber necessary to remove material from and deposit material to a substrate. In general, plasma is formed within the processing chamber under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

The semiconductor industry is constantly striving to produce smaller ICs and to increase the yield of viable ICs. Accordingly, the material processing equipment used to process the ICs have been required to meet increasingly more stringent performance requirements for etching and deposition processes (e.g., rate, selectivity, critical dimension, etc.).

SUMMARY OF THE INVENTION

The reproducibility of plasma processing operations can be assured if it is verified that important plasma parameters (e.g., plasma density) have values that lie between predetermined limits. Furthermore, it is most advantageous to be able to make such determinations using a real time measurement technique.

The electromagnetic behavior of a plasma provides useful information about the state of the plasma. For example, the emission and absorption of optical and/or infrared radiation, and the transmission/absorption of microwave radiation through a plasma are indicators of the plasma state. The present invention provides microwave techniques for the measurement of plasma density and the use of data obtained from such measurements may be used to control plasma properties by means of the automatic adjustment of RF power, pressure, gas composition, etc. The present invention relates to a method and apparatus for determination and control of a plasma state within a plasma chamber. The present invention advantageously provides a method and apparatus that enables semiconductor manufacturers to satisfy more stringent performance requirements for material processing equipment used in the semiconductor industry.

The present invention advantageously provides a first embodiment of a plasma processing system that includes a plasma chamber, an open resonator movably mounted within the plasma chamber, and a detector. The open resonator is configured to produce a microwave signal, and the detector is configured to detect the microwave signal and measure a mean electron plasma density along a path of the microwave signal within a plasma field of the plasma chamber. The plasma processing system preferably further includes a processor configured to receive a plurality of mean electron plasma density measurements from the detector that correspond to a location of the open resonator.

The processor is preferably configured to calculate plasma density within the plasma field as a function of position using the plurality of mean electron plasma density measurements. For example, the processor is configured to utilize tomographic inversion to calculate plasma density as a function of position using the plurality of mean electron plasma density measurements. The processor is configured to calculate plasma density as a function of position and determine whether a plasma density at a given location is within a predetermined range. The processor is configured to ensure that the plasma density at the given location is within the predetermined range. The processor is configured to control plasma properties by at least one of adjusting RF power, adjusting pressure within the plasma chamber, and adjusting gas composition within the plasma chamber.

The present invention further advantageously provides a second embodiment of a plasma processing system that includes a plasma chamber, a plurality of open resonators provided within the plasma chamber, a plurality of detectors, and a processor. The plurality of open resonators are configured to produce microwave signals, and the plurality of detectors are configured to detect the microwave signals and measure a mean electron plasma density along paths of the microwave signals within a plasma field of the plasma chamber. The processor is configured to receive a plurality of mean electron plasma density measurements from the detectors that correspond to locations of the plurality of open resonators.

The present invention additionally provides a method for controlling a plasma state within a plasma chamber. The method includes the steps of measuring mean electron plasma density along a path at a plurality of locations within a plasma field in the plasma chamber, and calculating plasma density within the plasma field as a function of position using the measured mean electron plasma density.

In a first embodiment of the method, the step of measuring mean electron plasma density preferably includes the steps of providing an open resonator that is movably mounted within the plasma chamber, where the open resonator is configured to produce a microwave signal, and detecting the microwave signal to measure the mean electron plasma density. In a second embodiment of the method, the step of measuring mean electron plasma density preferably includes the steps of providing a plurality of open resonators within the plasma chamber, where the plurality of open resonators are configured to produce microwave signals, and detecting the microwave signals to measure a mean electron plasma density along paths of the microwave signals within a plasma field of the plasma chamber.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

The present invention generally relates to fabrication of integrated circuits in the semiconductor industry. The present invention advantageously provides a method and apparatus that enables semiconductor manufacturers to satisfy more stringent performance requirements for material processing equipment used in the semiconductor industry.

Suppose that an open microwave resonator is immersed in a plasma and the frequency shift of a resonant frequency of a particular resonant mode due to the formation of plasma is determined. This determination provides a value of the mean electron density along the path between the reflectors of the open resonator, but it does not provide a value for the electron density in the neighborhood of an arbitrarily chosen point between the mirrors. The information obtained in this way is useful, but not nearly so useful as a determination of the electron density as a function of position. For example, for a two-dimensional system in which the electron density n depends on the distance r from a cylindrical axis and the azimuthal angle $\phi$, it would be advantageous to know $n(r, \phi)$. The typical capacitively-coupled plasma processor is intended to produce a plasma that is nearly uniform in the region in which wafer processing takes place. The plasma is nominally symmetrical with respect to a cylindrical axis perpendicular to and coaxial with the wafer chuck, but inevitably the plasma is dependent on the radial coordinate r.

Figure 2:
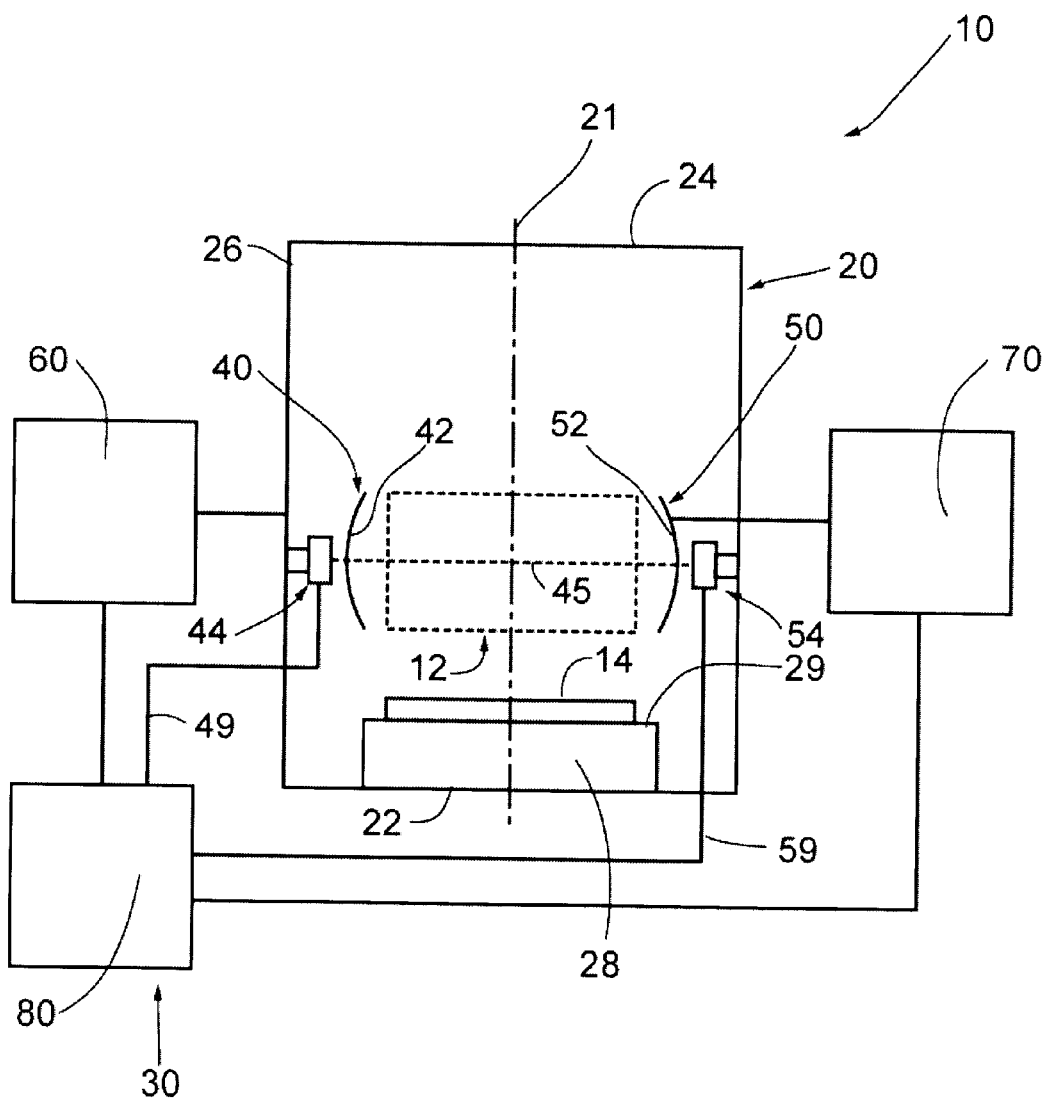
FIG. 2 is a schematic side view of a plasma processing system according to the first embodiment of the present invention.
Figure 3:
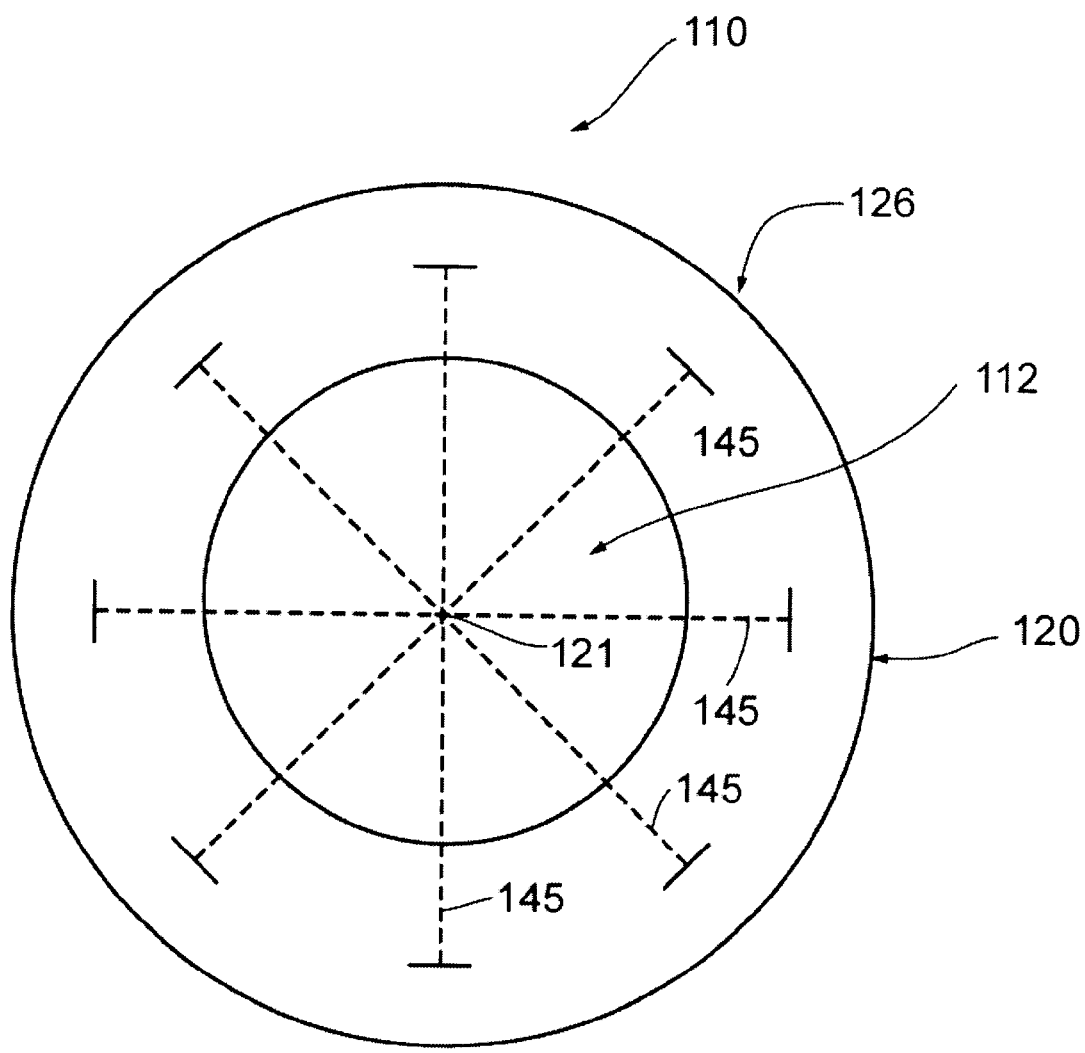
FIG. 3 is a schematic top view of a plasma chamber configuration including a plurality of open resonators according to a second embodiment of the present invention.
Figure 4:
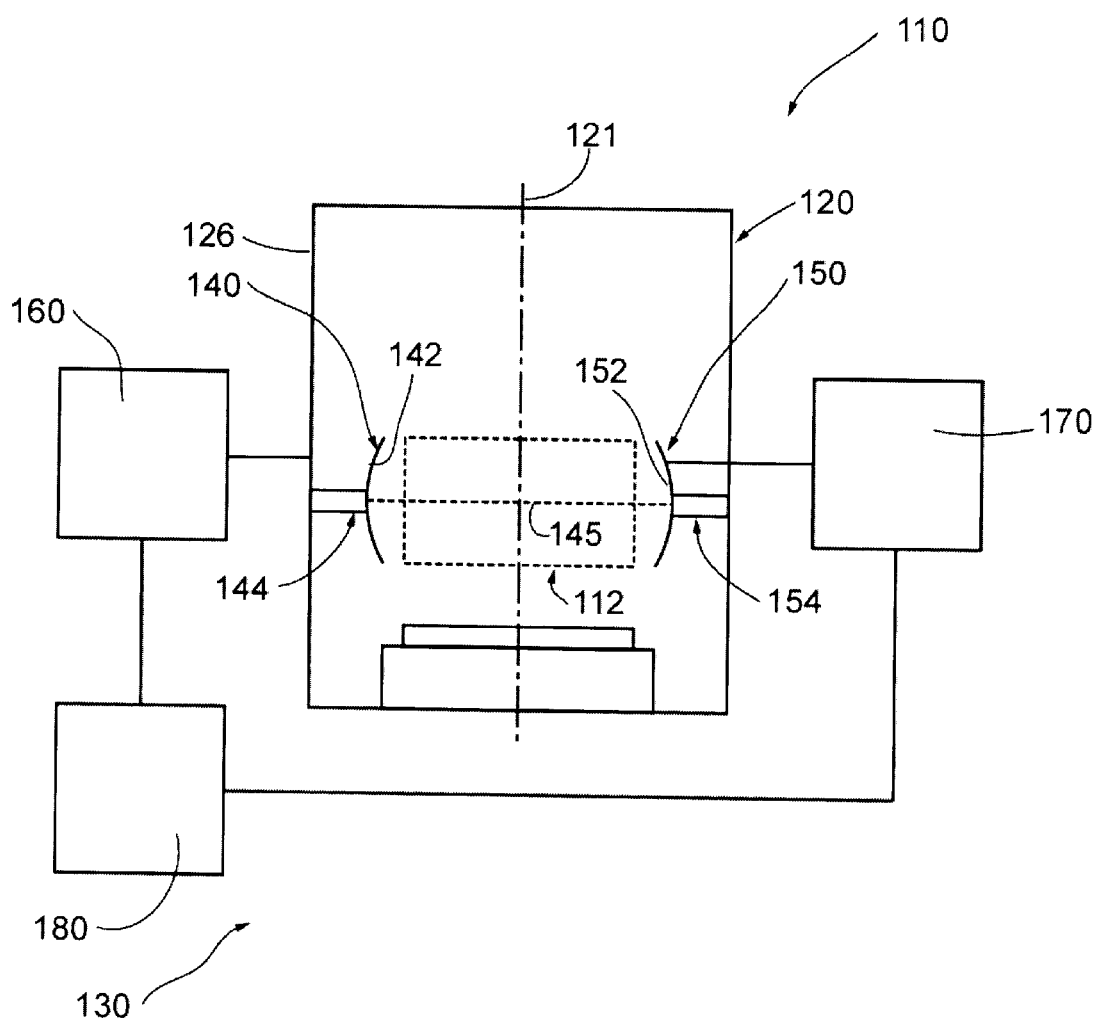
FIG. 4 is a schematic side view of a plasma processing system according to the second embodiment of the present invention.

The present invention provides an apparatus and method that can be used to determine $n(r, \phi)$ by using either a movable open resonator (FIGS. 1 and 2) or a plurality of open resonators (FIGS. 3 and 4). In the case of the single open resonator, the open resonator may be moved within the plasma processor while maintaining the open resonator's axis in an orientation perpendicular to a cylindrical axis of the plasma processor. If a plurality of open resonators are used, the resonators may be either simultaneously or sequentially excited. The axis of each of the plurality of open resonators is perpendicular to the cylindrical axis of the plasma processor (i.e., parallel to the surface of a wafer being processed).

A method of improving the performance of material processing equipment is to monitor and control plasma electron density within the processing chamber during the manufacturing process. Ideally, the plasma electron density is maintained such that the processes being performed are uniformly acting upon the entire surface of the substrate upon which work is being performed. The present invention advantageously utilizes tomographic inversion techniques to extract from the measured data the dependence of the electron density on position (i.e., $n(r, \phi)$). With precise information about $n(r, \phi)$ in hand, processor parameters may be changed to effect desired changes in $n(r, \phi)$. For example, the radio frequency (or RF) power may be increased or decreased, the chamber pressure may be raised or lowered, or the gas composition may be altered in order to create the desired conditions within the plasma chamber. Furthermore, automatic control of process parameters is possible by using digital signal processing techniques.

An exemplary device used to measure plasma electron density is a microwave system of suitably high frequency to exceed the electron plasma frequency. The device includes a pair of mirrors immersed in the plasma. Microwave power is coupled to a first microwave port on the first mirror and a detector is utilized to monitor the transmission of microwave power through the resonant cavity formed by the opposing mirror(s). The detector is either coupled to a second port on the first mirror or a second port on the second mirror. For a Gaussian beam, cavity transmission occurs at discrete frequencies. The discrete frequencies correspond to an integer number of half wavelengths between the apex of each mirror, as expressed by the following equation:

$$v_{m,n,q} = v_{0,0,q} = \frac{c}{2\eta d}\left(q + \frac{1}{2}\right), \quad (1)$$

where $v_{0,0,q}$ is a resonant frequency of mode order q (assuming only longitudinal modes, i.e. m=n=0), c is the speed of light in a vacuum, $\eta$ is the index of refraction for the medium bounded by the mirrors and d is the mirror spacing (apex-to-apex). For a vacuum, $\eta=1$, however, the presence of plasma or, more specifically, a population of free electrons leads to a reduction of the index of refraction or an observable increase (shift) of the cavity resonance frequencies $v_{0,0,q}$. For a given mode q, the shift in frequency can be related to the index of refraction n and, thereafter, the (integrated) electron density $<n_e>$, is expressed by the following equation:

$$\langle n_e \rangle \cong \frac{8\pi^2 \varepsilon_o}{e^2} v_o \Delta v, \quad (2)$$

for $v_o >> \omega_{pe}/2\pi$. For further details, the use of the above system to measure plasma electron density is described in International App. No. PCT/US00/19539 (based upon U.S. Ser. No. 60/144,880), International App. No. PCT/US00/19536 (based upon U.S. Ser. No. 60/144,883), International App. No. PCT/US00/19535 (based upon U.S. Ser. No. 60/144,878), and International App. No. PCT/US00/19540 (based upon U.S. Ser. No. 60/166,418), each of which is incorporated herein by reference in their entirety.

Figure 1:
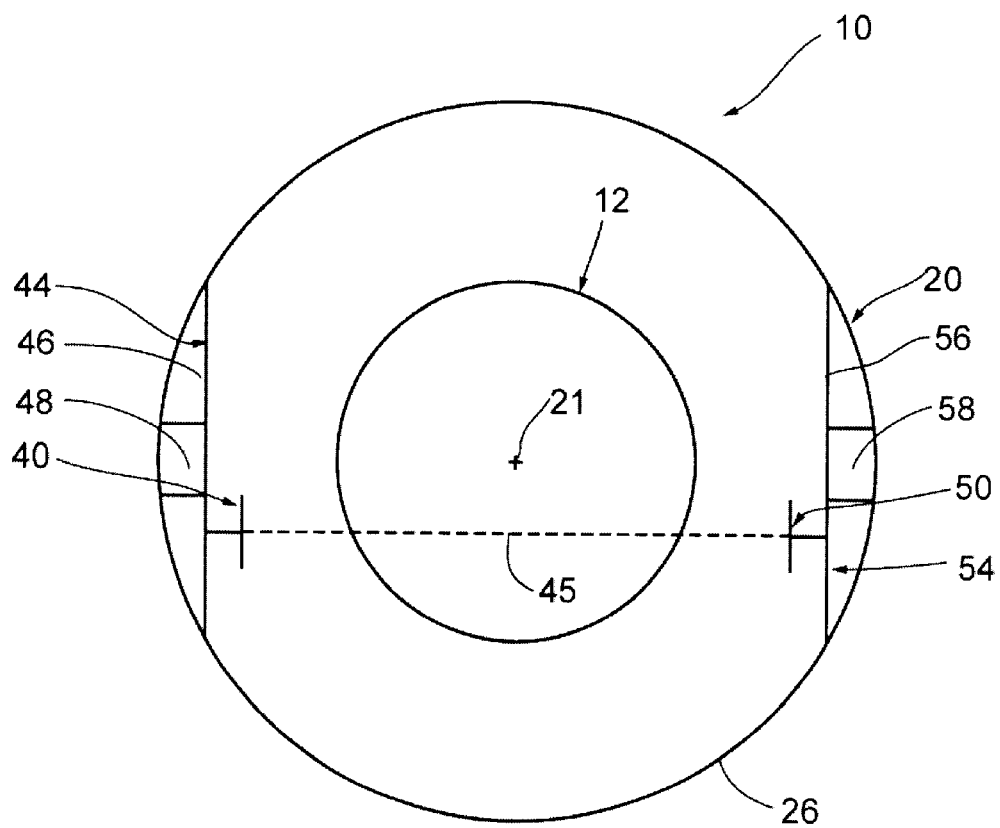
FIG. 1 is a schematic view of a plasma chamber configuration including a movable open resonator according to a first embodiment of the present invention.

A first embodiment of the plasma processing system 10 according to the present invention is depicted in FIGS. 1 and 2. The first embodiment provides a plasma processing system 10 including a plasma chamber 20 and a monitoring system 30 for use in the plasma chamber. The monitoring system preferably includes an open resonator preferably including a first microwave mirror 40 and a second microwave mirror 50, a power source 60, a detector 70, and a control system 80 including a processor. The open resonator is movably mounted within the plasma chamber 20, such that the first microwave mirror 40 is mounted on a track system 44 and the second microwave mirror 50 is mounted on a parallel track system 54.

The plasma chamber 20 generally includes a base wall 22, an upper wall 24, and a side wall 26 of a generally cylindrical shape having a cylindrical axis 21 that extends perpendicular to an upper surface of a wafer receiving chuck or substrate holder 28 provided within the plasma chamber 20. The substrate holder 28 having a wafer plane 29, such as an upper surface of the substrate holder 28, upon which a substrate 14 is positioned in order to be processed within the plasma chamber 20.

The first microwave mirror 40 has a concave surface 42 and is provided within the plasma chamber 20. The second microwave mirror 50 has a concave surface 52 and is also provided within the plasma chamber 20. The concave surface 52 of the second microwave mirror 50 is oriented opposite the concave surface 42 of the first microwave mirror 40. This geometry can be referred to as a confocal geometry when the spacing between the mirrors equals the radius of curvature of the mirrors. In an alternate embodiment, the mirrors are arranged in a semi-confocal configuration wherein a first mirror comprising a concave surface of radius of curvature R is located a distance d=R from a second mirror comprising a flat surface. In an alternate embodiment, the spacing d is adjusted to be different than the radius of curvature of both mirrors in the confocal arrangement or the radius of curvature of the first mirror in the semiconfocal arrangement. In an alternate embodiment, the radius of curvature for each mirror is arbitrary. The selection of the spacing and respective mirror radii of curvature is well known to those skilled in the art of designing resonant cavities. Alternately, the mirror surfaces 42, 52 can have flat and/or convex surfaces.

In the first embodiment depicted in FIGS. 1 and 2, the first microwave mirror 40 is mounted on a track system 44, and the second microwave mirror 50 is mounted on a parallel track system 54. The track systems are mounted to the side wall 26 of the plasma chamber 20. The track systems 44, 54 can be configured in many different ways. For example, the track systems 44, 54 can each include a track 46, 56 upon which the respective mirrors 40, 50 are mounted such that the mirrors 40, 50 can be moved along the tracks 46, 56 by motive devices (not shown), such as electric motors, etc. The tracks 46, 56 are mounted to the side wall 26 of the plasma chamber 20 by respective brackets 48, 58 such that the tracks 46, 56 extend in parallel within the chamber 20. The motive devices are configured to drive the mirrors 40, 50 (either simultaneously or individually) along the tracks 46, 56 such that a microwave signal path 45 can sweep an entire length across the plasma field 12. Additionally, position sensors are provided in the track systems 44, 45 that are configured to sense the position of the mirrors 40, 50 along the tracks 46, 56, and send a signal representing the position to the control system via wires 49, 59.

In an alternate embodiment, track systems 44, 54 and mirrors 40, 50 are mounted outside the chamber wall 26 of chamber 20. However, a dielectric window is inserted within the chamber wall 26 in order to permit the transmission of the microwave signal through the plasma. Alternately, track systems 44, 54 can be rotated (or pivoted) within the chamber 20 in order to permit an azimuthally variable sample of the plasma field 12.

The power source 60 is coupled to the first microwave mirror 40 and is configured to produce a microwave signal. The microwave signal produced by the power source 60 extends along a path or an axis 45 generally parallel to a wafer plane 29 of a substrate holder 28 adapted to be provided within the plasma chamber 20 and generally perpendicular to an axis 21 of the cylindrical side wall 26. In the first embodiment, the axis or path 45 of the microwave signal does not, in every location, pass through the cylindrical axis 21 of the plasma chamber 20.

The embodiment of the monitoring system 30 depicted in FIGS. 1 and 2 also includes the detector 70 coupled to the second microwave mirror 50. The open resonator is configured to produce the microwave signal and the detector 70 is configured to detect the microwave signal and measure a mean electron plasma density along a path 45 of the microwave signal within a plasma field 12 of the plasma chamber 20. The processor of the control system 80 is configured to receive a plurality of mean electron plasma density measurements from the detector 70 that correspond to a location of the open resonator (i.e., the location of the mirrors 40, 50 along the tracks 46, 56) as received by the processor via wires 49, 59. Accordingly, the present invention advantageously provides means for measuring mean electron plasma density along the path 45 at a plurality of locations within a plasma field 12 in the plasma chamber 20, and means for calculating plasma density within the plasma field 12 as a function of position using the measured mean electron plasma density.

The processor of the control system 80 is configured to calculate plasma density within the plasma field 12 as a function of position using the plurality of mean electron plasma density measurements. For example, the processor is configured to utilize tomographic inversion to calculate plasma density as a function of position using the plurality of mean electron plasma density measurements. The processor is configured to calculate plasma density as a function of position and determine whether a plasma density at a given location is within a predetermined range. The processor is configured to ensure that the plasma density at the given location is within the predetermined range, for example, by controlling plasma properties by at least one of adjusting RF power, adjusting pressure within the plasma chamber 20, and adjusting gas composition within the plasma chamber 20 such that the predetermined range is achieved. For further details, the principles of tomography are described in *The physical basis of computed tomography* (Marshall et al., Warren H, Green, Inc., St. Louis, Mo.) and *Process tomography* (Williams & Beck, Butterworth Heinemann, 1995.), and both are incorporated herein by reference in their entirety.

In the first embodiment depicted in FIGS. 1 and 2, the microwave mirrors 40 and 50 are immersed within the process plasma 12 such that the concave surfaces 42 and 52, respectively, oppose one another. Microwave power is input from the power source 60 to the first mirror 40 via a microwave aperture and the detector 70 is configured to monitor cavity transmission by being coupled to the opposite second mirror 50. The detector 70 can be coupled to either the mirror opposite to the mirror to which microwave power is input, as is the case in FIGS. 1 and 2, or the detector can be coupled to the same mirror to which microwave power is input (i.e. the first mirror 40 in FIGS. 1 and 2).

The mirrors 40 and 50 are preferably fabricated from aluminum. In alternative embodiments, the mirrors 40 and 50 are anodized with preferably a 10 to 50 micron thick anodization or coated with a material such as Yttria ($Y_2O_3$).

The microwave power source 60 is preferably an electronically tunable voltage controlled Gunn diode oscillator (VCO). When the VCO is biased with a direct current voltage, the output frequency can be varied over some spectral range. Therefore, the VCO specifications generally include center frequency, bandwidth and minimum output power. For example, at 35 GHz, a commercially available VCO is a WBV-28-20160RI Gunn diode oscillator offered by Millitech, LLC (20 Industrial Drive East, South Deerfield, Mass. 01373-0109). The specifications for this VCO include a center frequency of 35 GHz with plus or minus 1 GHz bandwidth and a minimum output power of 40 mW. The bias tuning range can generally extend from +25 V to −25 V, thereby adjusting this bias voltage leads to a change in the output frequency of the VCO. Alternatively, operation at higher frequencies, such as 70 GHz and 105 GHZ, can be achieved using a frequency doubler (MUD-15-16F00) or tripler (MUT-10-16F00) with the above mentioned VCO. Using the above configuration, a center frequency of 70 GHz with plus or minus 2 GHz bandwidth and a minimum output power of 0.4 to 0.9 mW and a center frequency of 105 GHz with plus or minus 3 GHz bandwidth and a minimum output power of 0.4 to 0.7 mW can be achieved, respectively. In a preferred embodiment, a 94 GHz VCO (Model GV-10) is used and is commercially available from Farran Technology LTD (Ballincollig, Cork, Ireland). The Model GV-10 VCO has a center frequency of 94 GHz with plus or minus 750 MHz bandwidth, a minimum output power of 10 mW, and a varactor tuning range of 0 to 20 V.

The detector 70 is preferably a general purpose diode detector such as those commercially available from Millitech LLC. For example, a DXP-15-RNFW0 and a DXP-10-RNFW0 are general purpose detectors in the V-band (50 to 75 GHz) and W-band (75 to 110 GHz), respectively.

The first embodiment of the present invention depicted in FIGS. 1 and 2 has a control system 80 that can include a lock-on circuit connected to the power source 60 and the detector 70, and a computer or processor connected to the lock-on circuit. The lock-on circuit can be utilized to lock the frequency of the microwave signal output from the microwave power source 60 to a pre-selected cavity resonance. The lock-on circuit superposes a dither signal (e.g. 1 kHz, 10 mV amplitude square wave) on a direct current voltage substantially near the voltage and related output VCO frequency that corresponds with a pre-selected longitudinal frequency in the resonant cavity between the mirrors 40 and 50 of FIGS. 1 and 2. The signal detected by the detector 70 is provided to the lock-on circuit, where it represents a first derivative of the cavity transmission function (transmitted power versus frequency). The signal input to the lock-on circuit from the detector 70 provides an error signal by which the direct current component of the VCO bias voltage is adjusted to drive the VCO output frequency to the frequency associated with the peak of a pre-selected longitudinal resonance. For further details, see International App. No. PCT/US00/19540 (based upon U.S. Ser. No. 60/166,418).

The introduction of plasma within the chamber 20 causes a shift in frequency for each of the resonances (i.e., each of the resonances shift when the electron density is increased or the index of refraction is decreased according to equation (1)). Therefore, once the output frequency of the VCO is locked to a selected cavity resonance, the direct current bias voltage with and without plasma can be recorded and the frequency shift of the selected resonance is determined from the voltage difference and the respective VCO calibration. For example, in wafer processing, the direct current bias voltage is recorded once a new wafer is received by the process tool for materials processing and prior to the ignition of plasma. Once the plasma is formed, the direct current bias voltage is obtained as a function of time for the given wafer and the time varying voltage difference or ultimately electron density (via equation (2)) is recorded. The processor of the control system 80 utilizes this information to calculate plasma density within the plasma field 12 as a function of position.

A second embodiment of the plasma processing system 110 according to the present invention is depicted in FIGS. 3 and 4. The plasma processing system 110 of the second embodiment includes many of the same components of the first. The second embodiment provides a plasma processing system 110 including a plasma chamber 120 and a monitoring system 130 for use in the plasma chamber. The monitoring system preferably includes a plurality of open resonators each preferably including a first microwave mirror 140 and a second microwave mirror 150, a power source 160, and a detector 170. A control system 180 including a processor is provided to control the plasma processing system 110. The open resonators are mounted within the plasma chamber 120 such that the pairs of first and second microwave mirrors 140, 150 are opposed to one another and preferably such that the pair of first and second mirrors 140, 150 are evenly distributed radially about an axis 121 of the plasma chamber 120.

The plasma chamber 120 has generally the same configuration as the plasma chamber 20 in the first embodiment. However, in the second embodiment depicted in FIGS. 3 and 4, the first mirror 140 is mounted to the side wall 126 via mounting structure 144 and the second mirror 150 is mounted to the side wall 126 via mounting structure 154, such that the first and second microwave mirrors 140, 150 are preferably mounted in a fixed position to the sides of the plasma chamber 120. The concave surface 152 of the second microwave mirror 150 is oriented opposite the concave surface 142 of the corresponding first microwave mirror 140.

Figure 5:
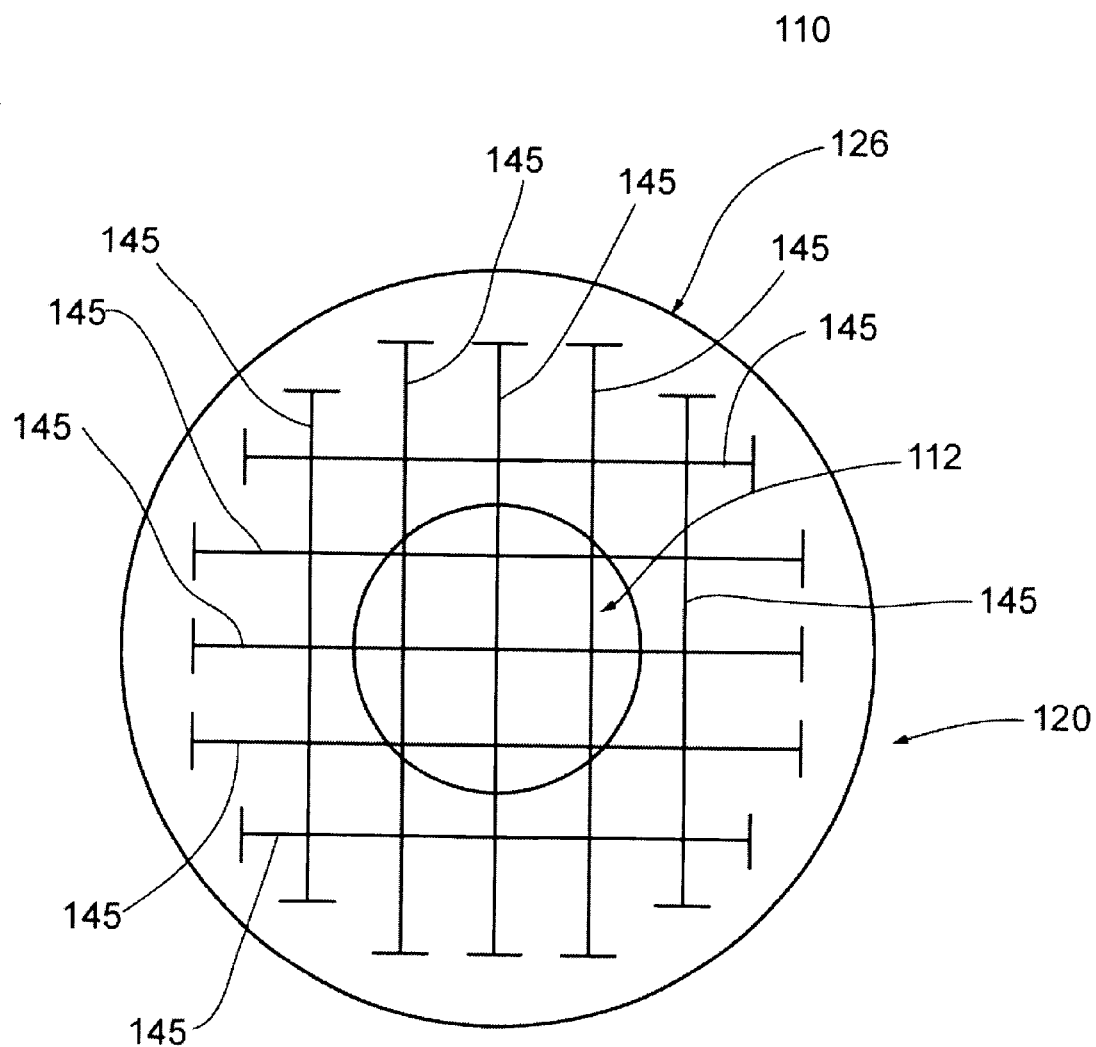
FIG. 5 is a schematic top view of a plasma chamber configuration including a plurality of open resonators according to another embodiment of the present invention.

The monitoring system 130 depicted in FIGS. 3 and 4 also includes the detector 170 coupled to each of the second microwave mirrors 150. The open resonator is configured to produce the microwave signal and the detector 170 is configured to detect the microwave signal and measure a mean electron plasma density along a path 145 of the microwave signal within a plasma field 112 of the plasma chamber 120. Each pair of mirrors forming an open resonator is configured to produce a microwave signal that extends along one of the paths 145. Preferably the paths 145 are perpendicular to and extend through or intersect at the cylindrical axis 121 of the plasma chamber 120, however, alternative embodiments can include paths 145 that do not extend through the axis 121. For example, FIG. 5 provides an alternate embodiment showing the open resonators in a grid configuration. The processor of the control system 180 is configured to receive a plurality of mean electron plasma density measurements from the detector 170 that correspond to a given open resonator and the predetermined location of the open resonator. Accordingly, the present invention advantageously provides means for measuring mean electron plasma density along the path 145 at a plurality of locations within a plasma field 112 in the plasma chamber 120, and means for calculating plasma density within the plasma field 112 as a function of position using the measured mean electron plasma density.

The processor of the control system 180 is configured to calculate plasma density within the plasma field 112 as a function of position using the plurality of mean electron plasma density measurements. For example, the processor is configured to utilize tomographic inversion to calculate plasma density as a function of position using the plurality of mean electron plasma density measurements. The processor is configured to calculate plasma density as a function of position and determine whether a plasma density at a given location is within a predetermined range. The processor is configured to ensure that the plasma density at the given location is within the predetermined range, for example, by controlling plasma properties by at least one of adjusting RF power, adjusting pressure within the plasma chamber 120, and adjusting gas composition within the plasma chamber 120 such that the predetermined range is achieved.

In the second embodiment, the plurality of open resonators can either be simultaneously excited or sequentially excited.

It should be noted that the second embodiment can be provided with microwave mirror pairs that are movably mounted within the plasma chamber in a manner similar to that described in the first embodiment. For example, the various pairs of microwave mirrors can be moved (e.g., simultaneously or independently) along a given path within the plasma chamber such that the entire plasma field is scanned. The mirrors can be configured to travel along a semi-circular path, for example, if four open resonators are provided (as depicted in FIG. 3), then the resonators can be configured to travel along a semi-circular path of forty-five degrees.

In an alternate embodiment, a pair of mirrors 40, 50, forming an open resonator as shown in FIG. 2, can be displaced vertically in a direction parallel to axis 21 in order to provide spatial resolution of the electron plasma density in the vertical direction. Similarly, in an alternate embodiment, mirror pairs 140, 150, forming open resonators as shown in FIG. 4, can be stacked in the vertical direction parallel with axis 121 in order to provide spatial resolution of the electron plasma density in the vertical direction.

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

What is claimed is:

1. A plasma processing system comprising:
   a plasma chamber;
   an open resonator movably mounted within said plasma chamber, said open resonator being configured to produce a microwave signal; and
   a detector configured to detect the microwave signal and measure a mean electron plasma density along a path of the microwave signal within a plasma field of said plasma chamber.

2. The plasma processing system according to claim 1, further comprising a processor configured to receive a plurality of mean electron plasma density measurements from said detector that correspond to a location of said open resonator.

3. The plasma processing system according to claim 2, wherein said processor is configured to calculate plasma density within the plasma field as a function of position using the plurality of mean electron plasma density measurements.

4. The plasma processing system according to claim 2, wherein said processor is configured to utilize tomographic inversion to calculate plasma density as a function of position using the plurality of mean electron plasma density measurements.

5. The plasma processing system according to claim 2, wherein said processor is configured to calculate plasma density as a function of position and determine whether a plasma density at a given location is within a predetermined range.

6. The plasma processing system according to claim 5, wherein said processor is configured to control the system to maintain the plasma density at the given location within the predetermined range.

7. The plasma processing system according to claim 2, wherein said processor is configured to control at least one plasma property by at least one of adjusting RF power, adjusting pressure within said plasma chamber, and adjusting gas composition within said plasma chamber.

8. The plasma processing system according to claim 1, wherein said open resonator comprises a first microwave mirror and a second microwave mirror oriented opposite said first microwave mirror.

9. The plasma processing system according to claim 1, wherein said plasma chamber is cylindrical in shape and has a cylindrical axis that extends perpendicular to an upper surface of a wafer receiving chuck provided within said plasma chamber, said open resonator being configured to produce the microwave signal generally along an axis that is perpendicular to said cylindrical axis.

10. The plasma processing system according to claim 9, wherein the axis of the microwave signal does not pass through the cylindrical axis of said plasma chamber.

11. A plasma processing system comprising:
    a plasma chamber;
    a plurality of open resonators provided within said plasma chamber, said plurality of open resonators being configured to produce microwave signals;
    a plurality of detectors configured to detect the microwave signals and measure a mean electron plasma density along paths of the microwave signals within a plasma field of said plasma chamber; and
    a processor configured to receive a plurality of mean electron plasma density measurements from said detectors that correspond to locations of said plurality of open resonators.

12. The plasma processing system according to claim 11, wherein said processor is configured to calculate plasma density within the plasma field as a function of position using the plurality of mean electron plasma density measurements.

13. The plasma processing system according to claim 12, wherein said processor is configured to utilize tomographic inversion to calculate plasma density as a function of position using the plurality of mean electron plasma density measurements.

14. The plasma processing system according to claim 12, wherein said processor is configured to calculate plasma density as a function of position and determine whether a plasma density at a given location is within a predetermined range.

15. The plasma processing system according to claim 14, wherein said processor is configured to control the system to maintain the plasma density at the given location within the predetermined range.

16. The plasma processing system according to claim 11, wherein said processor is configured to control plasma properties by at least one of adjusting RF power, adjusting pressure within said plasma chamber, and adjusting gas composition within said plasma chamber.

17. The plasma processing system according to claim 11, wherein said plurality of open resonators each comprise a first microwave mirror and a second microwave mirror oriented opposite said first microwave mirror.

18. The plasma processing system according to claim 11, wherein:
said plasma chamber is cylindrical in shape and has a cylindrical axis that extends perpendicular to an upper surface of a wafer receiving chuck provided within said plasma chamber; and
said plurality of open resonators are configured to produce microwave signals generally along axes that are perpendicular to said cylindrical axis.

19. The plasma processing system according to claim 11, wherein said plurality of open resonators are simultaneously excited.

20. The plasma processing system according to claim 11, wherein said plurality of open resonators are sequentially excited.

21. A plasma processing system comprising:
a plasma chamber;
means for measuring mean electron plasma density along a path at a plurality of locations within a plasma field in said plasma chamber; and
means for calculating plasma density within the plasma field as a function of position using the measured mean electron plasma density.

22. The plasma processing system according to claim 21, wherein said means for measuring comprises:
an open resonator movably mounted within said plasma chamber, said open resonator being configured to produce a microwave signal; and
a detector configured to detect the microwave signal and measure the mean electron plasma density.

23. The plasma processing system according to claim 22, wherein said open resonator comprises a first microwave mirror and a second microwave mirror oriented opposite said first microwave mirror.

24. The plasma processing system according to claim 22, wherein said plasma chamber is cylindrical in shape and has a cylindrical axis that extends perpendicular to an upper surface of a wafer receiving chuck provided within said plasma chamber, said open resonator being configured to produce the microwave signal generally along an axis that is perpendicular to said cylindrical axis.

25. The plasma processing system according to claim 21, wherein said means for calculating comprises a processor configured to receive a plurality of mean electron plasma density measurements from said means for measuring that correspond to a location of said open resonator.

26. The plasma processing system according to claim 25, wherein said processor is configured to utilize tomographic inversion to calculate plasma density as a function of position using the plurality of mean electron plasma density measurements.

27. The plasma processing system according to claim 25, wherein said processor is configured to calculate plasma density as a function of position and determine whether a plasma density at a given location is within a predetermined range.

28. The plasma processing system according to claim 27, wherein said processor is configured to control the system to maintain the plasma density at the given location within the predetermined range.

29. The plasma processing system according to claim 25, wherein said processor is configured to control plasma properties by at least one of adjusting RF power, adjusting pressure within said plasma chamber, and adjusting gas composition within said plasma chamber.

30. The plasma processing system according to claim 21, wherein said means for measuring comprises:
a plurality of open resonators provided within said plasma chamber, said plurality of open resonators being configured to produce microwave signals; and
a plurality of detectors configured to detect the microwave signals and measure a mean electron plasma density along paths of the microwave signals within a plasma field of said plasma chamber.

31. The plasma processing system according to claim 30, wherein:
said plasma chamber is cylindrical in shape and has a cylindrical axis that extends perpendicular to an upper surface of a wafer receiving chuck provided within said plasma chamber; and
said plurality of open resonators are configured to produce microwave signals generally along axes that are perpendicular to said cylindrical axis.

32. The plasma processing system according to claim 30, wherein said plurality of open resonators are simultaneously excited.

33. The plasma processing system according to claim 30, wherein said plurality of open resonators are sequentially excited.

34. A method for controlling a plasma state within a plasma chamber, said method comprising the steps of:
measuring mean electron plasma density along a path at a plurality of locations within a plasma field in the plasma chamber; and
calculating plasma density within the plasma field as a function of position using the measured mean electron plasma density.

35. The method according to claim 34, wherein the step of measuring mean electron plasma density comprises the steps of:
providing an open resonator that is movably mounted within the plasma chamber, the open resonator being configured to produce a microwave signal; and
detecting the microwave signal to measure the mean electron plasma density.

36. The method according to claim 35, wherein the plasma chamber is cylindrical in shape and has a cylindrical axis that extends perpendicular to an upper surface of a wafer receiving chuck provided within the plasma chamber, and wherein the microwave signal is produced by the open resonator generally along an axis that is perpendicular to the cylindrical axis.

37. The method according to claim 35, wherein the step of calculating plasma density comprises receiving a plurality of mean electron plasma density measurements that correspond to a location of the open resonator.

38. The method according to claim 37, wherein the step of calculating plasma density comprises utilizing tomographic inversion to calculate plasma density as a function of position using the plurality of mean electron plasma density measurements.

39. The method according to claim 37, further comprising the step of determining whether a plasma density at a given location is within a predetermined range.

40. The method according to claim 39, further comprising the step of maintaining the plasma density at the given location within the predetermined range.

41. The method according to claim 40, further comprising the step of controlling plasma properties by at least one of adjusting RF power, adjusting pressure within the plasma chamber, and adjusting gas composition within the plasma chamber.

42. The method according to claim 34, wherein the step of measuring mean electron plasma density comprises the steps of:

providing a plurality of open resonators within the plasma chamber, the plurality of open resonators being configured to produce microwave signals; and detecting the microwave signals to measure a mean electron plasma density along paths of the microwave signals within a plasma field of the plasma chamber.

43. The method according to claim 42, wherein the plasma chamber is cylindrical in shape and has a cylindrical axis that extends perpendicular to an upper surface of a wafer receiving chuck provided within the plasma chamber, and wherein the microwave signals are produced by the plurality of open resonators generally along axes that are perpendicular to and extend through the cylindrical axis.

44. The method according to claim 42, wherein the plurality of open resonators are simultaneously excited.

45. The method according to claim 42, wherein the plurality of open resonators are sequentially excited.

* * * * *